(12) United States Patent
Nagata

(10) Patent No.: US 8,593,538 B2
(45) Date of Patent: Nov. 26, 2013

(54) SOLID STATE IMAGING DEVICE

(75) Inventor: Kazuhiro Nagata, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 558 days.

(21) Appl. No.: 12/870,262

(22) Filed: Aug. 27, 2010

(65) Prior Publication Data

US 2011/0074960 A1     Mar. 31, 2011

(30) Foreign Application Priority Data

Sep. 30, 2009    (JP) ................. 2009-228927

(51) Int. Cl.
*H04N 3/14*     (2006.01)
*H04N 5/335*    (2011.01)

(52) U.S. Cl.
USPC ........ 348/222.1; 348/294; 348/298; 348/302; 348/312

(58) Field of Classification Search
USPC ............. 348/222.1, 294, 298, 302, 312; 257/434, 435; 438/69, 75
See application file for complete search history.

(56) References Cited

U.S. PATENT DOCUMENTS 7,153,720 B2 * 12/2006 Augusto ................. 438/69
2006/0278948 A1 * 12/2006 Yamaguchi et al. ...... 257/444

FOREIGN PATENT DOCUMENTS

JP    2001-85656     3/2001
JP    2005-268643    9/2005

OTHER PUBLICATIONS

Combined Taiwanese Office Action and Search Report issued Mar. 28, 2013, in Taiwanese Patent Application No. 099129106 with English translation and English translation of category of cited documents.

* cited by examiner

*Primary Examiner* — Yogesh Aggarwal
(74) *Attorney, Agent, or Firm* — Oblon, Spivak, McClelland, Maier & Neustadt, L.L.P.

(57) ABSTRACT

According to one embodiment, a solid state imaging device has a semiconductor substrate. First, second and third photoelectric conversion portions are provided in a surface region of the semiconductor substrate. A blue color filter has a film thickness to give a first light path length. A green color filter has a film thickness to give a second light path length longer than the first light path length. A red color filter has a film thickness to give a third light path length longer than the second light path length. A flattening film is formed on the blue color filter, the green color filter and the red color filter. The flattening film flats steps of the color filters. Micro lenses are provided on the flat film. Each of the micro lenses is formed at a position corresponding to each of the first, second and third photoelectric conversion portions.

14 Claims, 4 Drawing Sheets

SOLID STATE IMAGING DEVICE

CROSS-REFERENCE TO RELATED APPLICATION(S)

This application is based upon and claims the benefit of priority from the prior Japanese Patent Application No. 2009-228927, filed on Sep. 30, 2009, the entire contents of which are incorporated herein by reference.

FIELD

Embodiments explained herein relates generally to a solid state imaging device which is provided with color filters.

BACKGROUND

CMOS and CCD solid state imaging devices are well known as solid state imaging devices. The CMOS solid state imaging device is represented by a CMOS image sensor, and the CCD solid state imaging device is represented by a CCD image sensor. Two types of CMOS solid state imaging devices are known. One is a front side illumination type, and the other is a back side illumination type. In the front side illumination solid state imaging device, incident light is entered from a front surface of a semiconductor substrate. In the back side illumination solid state imaging device, incident light is entered from a back surface of a semiconductor substrate.

The back side illumination solid state imaging device enables high image quality and can increase the number of pixels, compared with the front side illumination solid state imaging device, and, thus, the former has been developed widely in recent years. JP 2005-268643-A discloses such a back side illumination solid state imaging device.

The back side illumination solid state imaging device shown in the patent publication is provided with micro lenses and a silicon substrate in which a photoelectric conversion portions are formed. The micro lenses condense incident light, and the condensed incident light is entered into the photoelectric conversion portions. The micro lenses are formed of an organic material and have a low refractive index. The silicon substrate has a high refractive index. Accordingly, when an incident light enters into the photoelectric conversion portions from the micro lenses, degradation of images arises due to interference of the incident light, and the transmission rate of the incident light is lowered.

DETAILED DESCRIPTION

Figure 1:
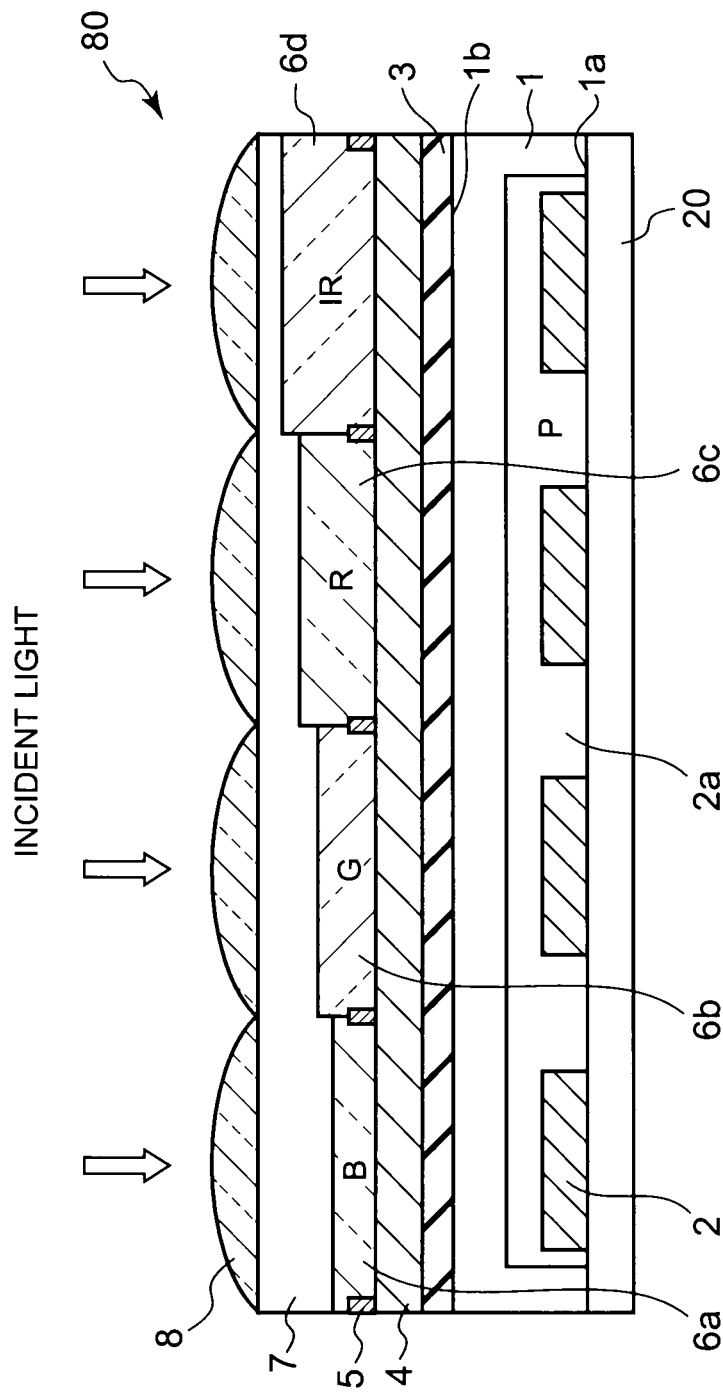
FIG. 1 is a sectional view showing a back side illumination solid state imaging device according to an embodiment schematically.

According to one embodiment, a solid state imaging device is provided. The device has a semiconductor substrate. First, second and third photoelectric conversion portions are provided in a surface region of the semiconductor substrate.

A blue color filter is provided at a position corresponding to the first photoelectric conversion portion, and has a film thickness to give a first light path length. A green color filter is provided at a position corresponding to the second photoelectric conversion portion, and has a film thickness to give a second light path length longer than the first light path length. A red color filter is provided at a position corresponding to the third photoelectric conversion portion, and has a film thickness to give a third light path length longer than the second light path length.

A flattening film is formed on the blue color filter, the green color filter and the red color filter, and the flattening film flats steps of the color filters. Micro lenses are provided on the flat film. Each of the micro lenses is formed at a position corresponding to each of the first, second and third photoelectric conversion portions.

According to another embodiment, a solid state imaging device is provided. The device has a semiconductor substrate which has two principal surfaces. An interconnection region portion formed on one of the principal surfaces of the semiconductor substrate. First, second and third photoelectric conversion portions are formed in a surface region of the semiconductor substrate. The surface region is in contact with the one of the principal surfaces.

A blue color filter is provided at a position corresponding to the first photoelectric conversion portion on a side of the other of the principal surfaces of the semiconductor substrate. The blue color filter has a film thickness to give a first light path length. A green color filter is provided at a position corresponding to the second photoelectric conversion portion on the side of the other of the principal surfaces of the semiconductor substrate. The green color filter has a film thickness to give a second light path length longer than the first light path length. A red color filter is provided at a position corresponding to the third photoelectric conversion portion on the side of the other of the principal surfaces of the semiconductor substrate. The red color filter has a film thickness to give a third light path length longer than the second light path length.

A flattening film is formed on the blue color filter, the green color filter and the red color filter. The flattening film flats steps of the color filters. Micro lenses are provided on the flat film. Each of the micro lenses being formed at a position corresponding to each of the first, the second and the third photoelectric conversion portions.

Hereinafter, further embodiments will be described with reference to the drawings. In the drawings, the same numerals indicate the same or similar portions respectively.

FIG. 1 is a sectional view showing a solid state imaging device according to an embodiment schematically.

In FIG. 1, a solid state imaging device 80 is shown. The solid state imaging device 8 is a back side illumination type. An incident light is entered from a back surface of a silicon substrate 1. The back surface is a principal surface 1b of the silicon substrate 1 on a side opposite to a principal surface 1a of the silicon substrate 1 where an interconnection region portion is formed as will be described below.

The solid imaging device 80 is a CMOS image sensor, and has photoelectric conversion portions 2. The photoelectric conversion portions 2 are pixels to perform photoelectric conversion of the incident light. Electric signal obtained by the photoelectric conversion in the photoelectric conversion portions 2 is processed in a signal processing portion (not shown).

The solid imaging device 80 may be applied to a cellular phone with a camera which requires high image quality and incorporation of a lot of pixels, a digital camera or a digital video system. The incident light may be a natural light, i.e., sunlight, having a coherent length of about several μm, a fluorescent light or a light of a lamp having a coherent length of about 3 μm.

The silicon substrate 1 is arranged face down. Specifically, the side of the principal surface 1a of the silicon substrate 1 is arranged in a down direction in FIG. 1, and the side of the principal surface 1b (the back surface) is arranged in a upper direction in FIG. 1. The refractive index of the silicon substrate 1 is in the range from 3.5 to 5.2, for example, and is larger than those of color filters 6a to 6d or micro lenses 8. The photoelectric conversion portions 2 described above are formed at the principal surface 1a of the silicon substrate 1 in a two-dimensional manner.

Each of the photoelectric conversion portions 2 is composed of a silicon photo diode with a 3 μm thickness, for example. Each silicon photo diode includes a p type layer formed in contact with the principal surface 1a and an N type layer formed in contact with the principal surface 1b on the side of the principal surface 1b.

Each of the photoelectric conversion portions 2 has sensitivity in the range from 400 to 1100 nm wavelength, and converts incident light into an electric signal. A interconnection region portion 20 is provided on the principal surface 1a of silicon substrate 1. The interconnection region portion 20 has an interconnection to connect between the photoelectric conversion portions 2 and a signal processing portion (not illustrate) electrically.

A P type well region 2a is formed in the silicon substrate 1. The P type well region 2a is formed by ion implantation, for example. The P type well region 2a separates the photoelectric conversion portions 2, as an element isolation layer.

An insulating film 3 is formed on the principal surface (back surface) 1b of the silicon substrate 1. The insulating film 3 is transparent to a visible light of the range from 400 to 700 nm, and to an infrared light of the range from 700 to 1000 μm. An antireflection film 4 is formed on the insulating film 3. The antireflection film 4 is formed of a silicon nitride film (a SiN film), for example.

On the antireflection film 4, a blue color filter 6a, a green color filter 6b, a red color filter 6c and an infrared color filter 6d are formed at respective positions corresponding to the photoelectric conversion portions 2. The color filters 6a to 6d are formed of materials such as inorganic materials or organic materials in which colorants are added respectively.

Each of the color filters 6a to 6d may be formed of a single inorganic material. Each of the color filters 6a to 6d may be formed by laminating insulating films of inorganic material having a relatively large refractive index and insulating films of inorganic material having a relatively small refractive index alternately and repeatedly. Light shielding members 5 are provided on the antireflection film 4 and between the color filters 6a to 6d, in order to prevent mutual interference of the adjoining ones of the color filters.

The blue color filter 6a has an optical characteristic of a color band of 400 to 500 nm and a main wavelength of 450 nm, for example. The green color filter 6b has an optical characteristic of a color band of 500 to 600 nm and a main wavelength of 540 nm, for example. The red color filter 6c has an optical characteristic of a color band 600 to 700 nm and a main wavelength of 610 nm, for example. The infrared color filter 6d has an optical characteristic of a color band of 700 to 1000 nm and a main wavelength of 800 nm, for example.

The blue color filter 6a has a film thickness which gives a light path length La. The green color filter 6b has a film thickness which gives a light path length Lb. The red color filter 6c has a film thickness which gives a light path length Lc. The infrared color filter 6d has a film thickness which gives a light path length Ld. The light path length means a product n×d generally in the case that a light entered into a surface of a color filter of a refractive index "n" advances by a distance "d" along the light path in the inside of the color filter.

The relationship between the light path lengths La to Ld is as shown by the following formula.

$$La < Lb < Lc < Ld \tag{1}$$

The Film thickness and refractive index of the color filters 6a to 6d are set respectively to satisfy the formula (I). Accordingly, the surface heights of the color filters 6a to 6d are different from one another.

A flattening film 7 is provided on the color filters 6a to 6d. The flattening film 7 flats the steps between the color filters. A resin group film transparent to a visible light and an infrared light may be used as the flattening film 7. The resin group film may be a resin such as acrylic resin, polycarbonate resin, cellulose group resin, or norbornene group resin.

Micro lenses 8 to condense incident light are provided on the flattening film 7 which has a flat surface. The micro lenses 8 are arranged at respective positions corresponding to the photoelectric conversion portions 2. The micro lens 8 is formed by carrying out heat flow of thermoplastics, for example, at a temperature of or beyond a glass transition point. The micro lenses 8 have a refractive index of 1.58, for example.

As the flattening film 7 is provided, the steps of the color filters 6a to 6d do not influence forming the micro lenses 8, and, moreover, the flatness of the micro lenses 8 is improved. As a result, the manufacturing yield of the solid state imaging device 80 can be improved.

Figure 2:
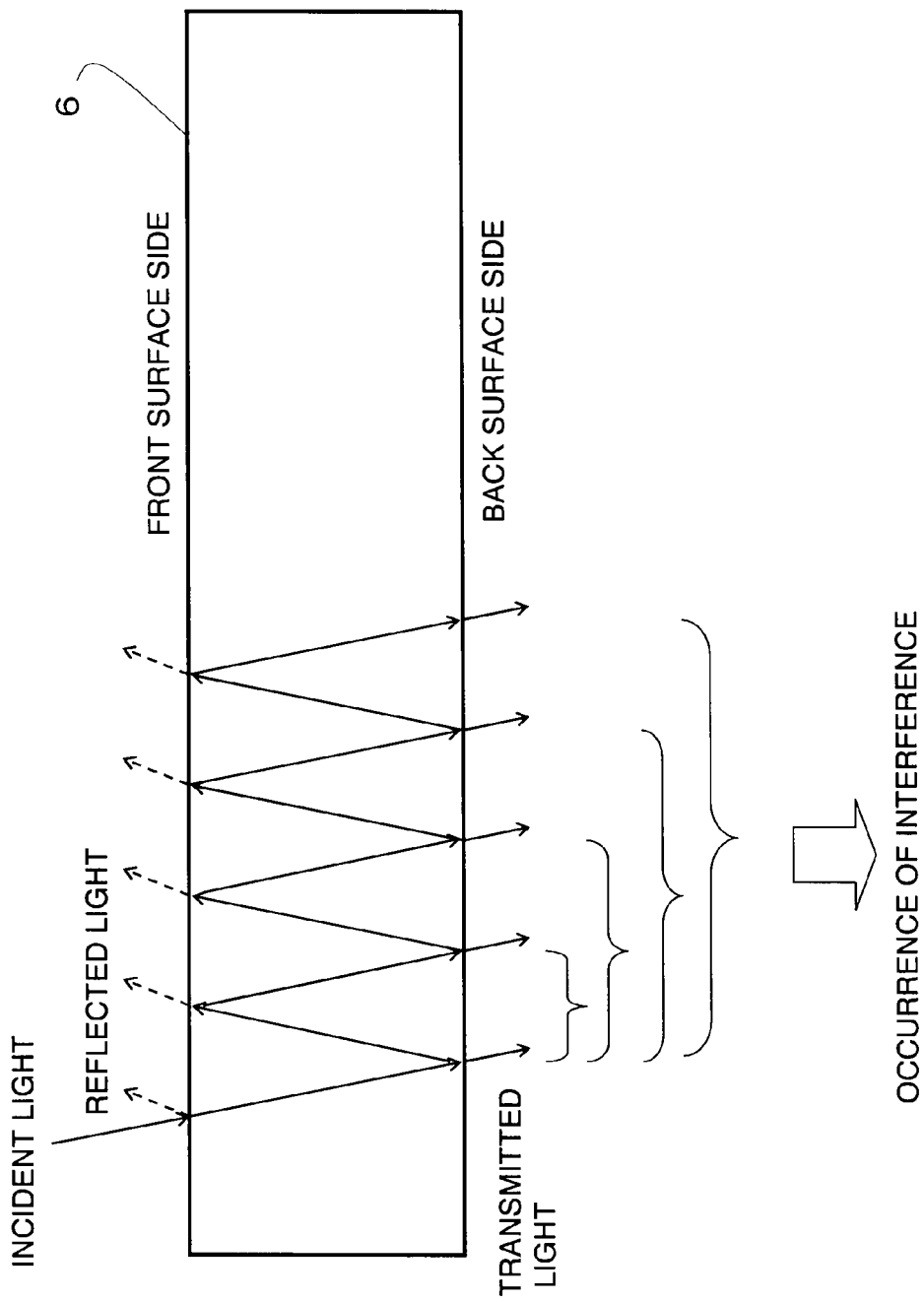
FIG. 2 is a view to explain interference of incident light which arises in a color filter arranged in the embodiment.
Figure 3:
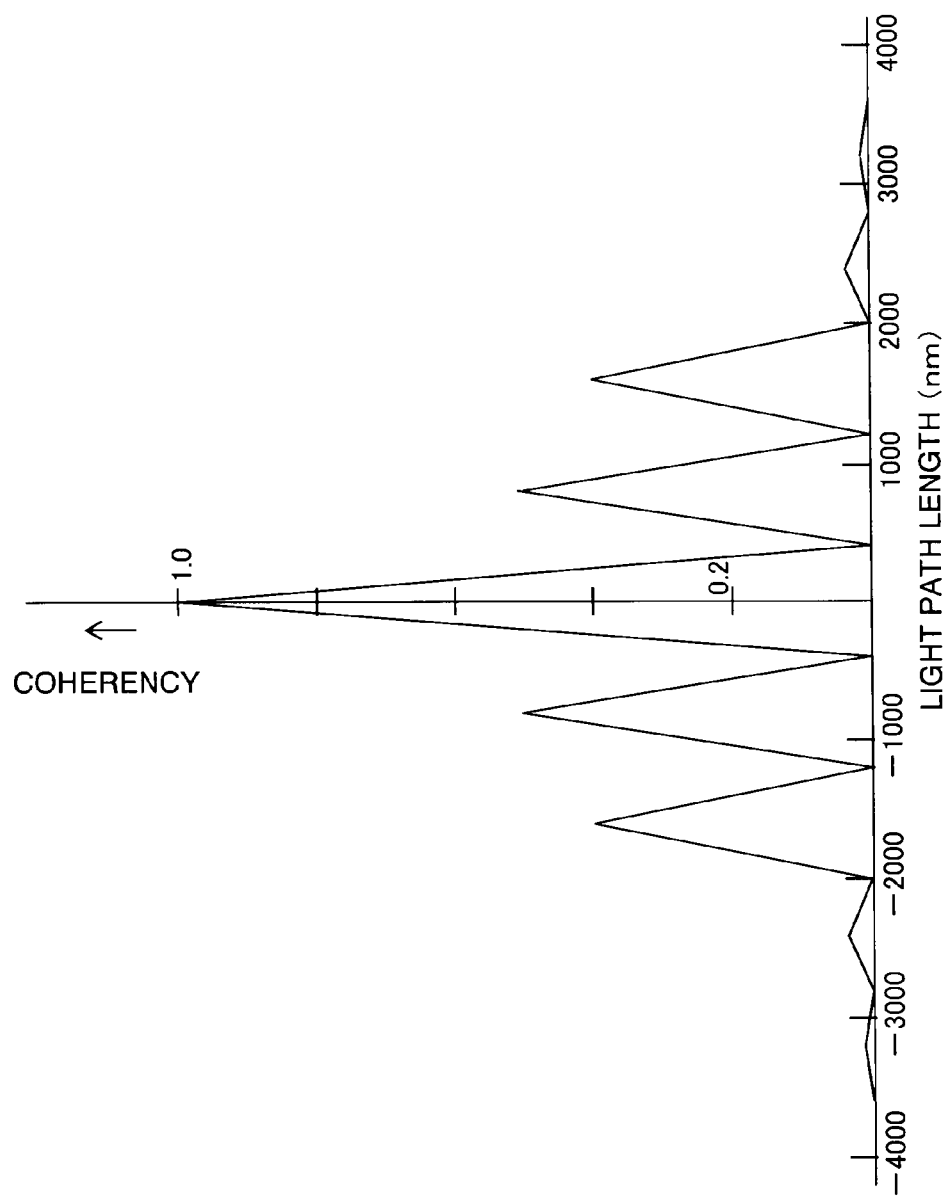
FIG. 3 is a view showing the relationship between a light path length and a coherency being indicated when incident light enters into a color filter in the embodiment.
Figure 4:
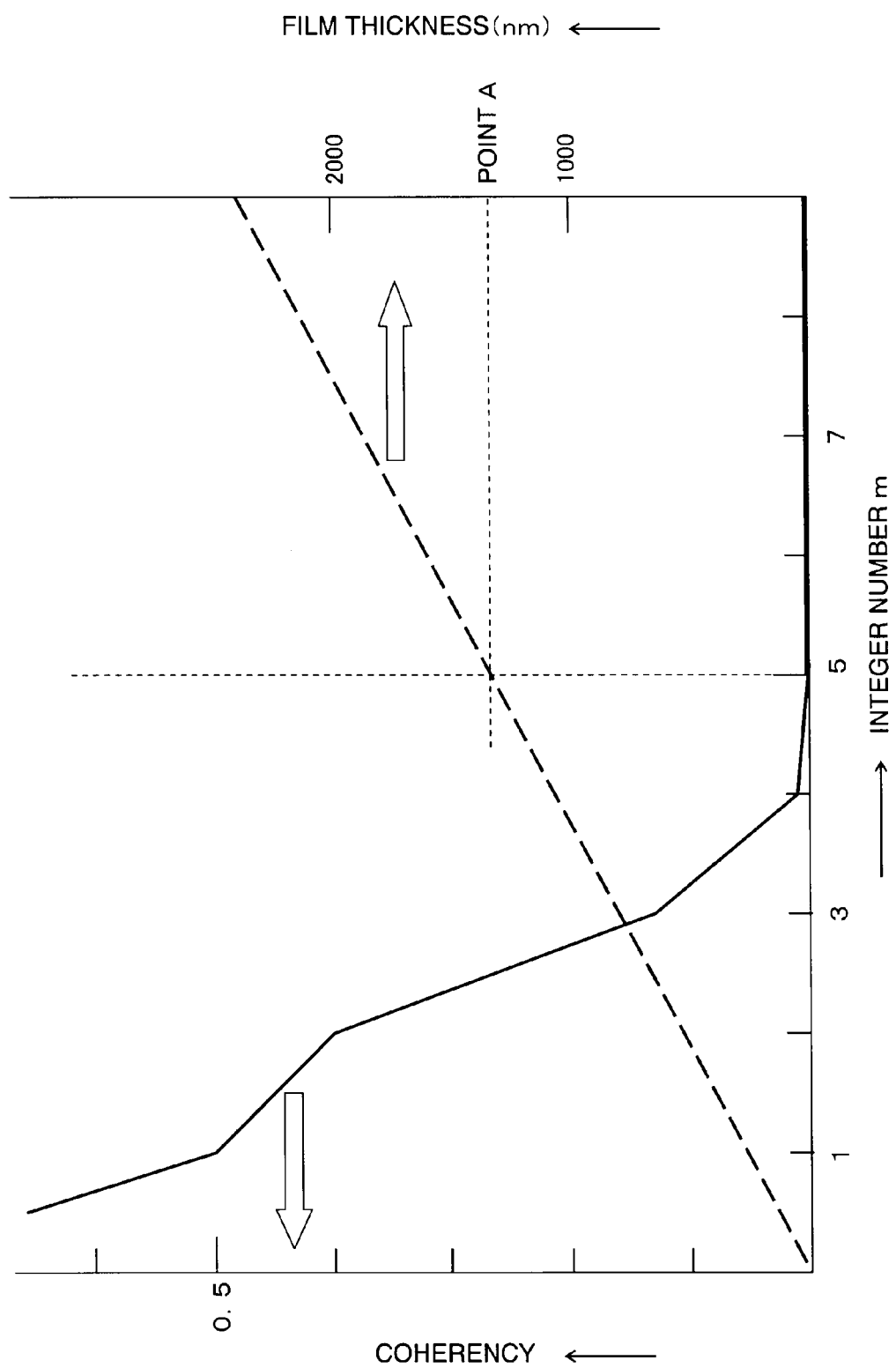
FIG. 4 is a view showing the relationship between a coherency and a film thickness of a color filter with respect to an integer number "m" which gives the film thickness based on a formula.

Setting of the refractive indexes and film thicknesses of the color filters in consideration of the coherency of incident light will be explained with reference to FIGS. 2 to 4. FIG. 2 is a view to explain interference of an incident light which arises in a color filter. FIG. 3 is a view showing the relationship between a light path length and a coherency being indicated when an incident light enters into a color filter. FIG. 4 is a view showing the relationship between a coherency and the film thickness of a color filter with respect to an integer number "m" which gives the film thickness based on a formula.

As shown in FIG. 2, an incident light enters from a front surface side of a parallel-plate shaped color filter 6, and part of the incident light is reflected as a reflection light. The color filter 6 is equivalent to each of the color filters 6a to 6d of FIG. 1. The incident light penetrated the inside of the color filter 6 is outputted from the back surface side as a first transmission light. The reflected part of the incident light is reflected at the back surface side is reflected at the front surface side, and is outputted from the back surface side as a second transmission light. Similarly, a third transmission light is outputted from the back surface side, a fourth transmission light is outputted from the back surface side, and a fifth transmission light is outputted from the back surface side.

The transmission lights of the color filter 6 are strengthened mutually when the following formula is satisfied, where "d" is a film thickness of the color filter, "n" is a refractive index of the color filter, "λ" is a wavelength of the incident light is, and "m" is an integer number.

$$2 \cdot nd = (\lambda/2) \times (2m) \tag{2}$$

On the other hand, the transmission lights are weakened mutually when the following formula is satisfied.

$$2 \cdot nd = (\lambda/2) \times (2m+1) \quad (3)$$

The transmission rate of the color filter 6 becomes the maximum, if the light path length of the color filter is an integral multiple of a half-wave length of the incident light. For this purpose, what is necessary is to set the film thickness d of the color filter so as to satisfy the following formula.

$$d = (\lambda \times m)/(2n) \quad (4)$$

As shown in FIG. 3, coherency is lowered steeply as the light path length of a incident light entering into a color filter becomes longer, in the case that the incident light is a natural light (sunlight) whose coherent length is considerably short compared with that of a light such as a laser beam, a fluorescent light or a light of a lamp.

The coherency is defined as a necessary condition to produce interference of transmitted lights. When the value of coherency is large, interference of transmitted lights becomes easy to be produced. When the value of coherency is very small, generation of interference of transmitted lights can not be eliminated completely, but can be reduced drastically.

The value of coherency can be calculated, as will be shown below, in the case of the infrared color filter 6d shown in FIG. 1. The calculation is performed assuming that a natural light is adopted as an incident light, the transmission light wavelength λ is 800 nm that is a main wavelength of the color band of the infrared color filter 6d, and the refractive index n of the infrared color filter 6d is 1.5.

The value of coherency is 0.5 when m denoted in the formula (4) is 1 (one). The value of coherency is 0.4 when m is 2 (two). The coherency value of is 0.13 when m is 3 (three). The value of coherency is 0.01 when m is 4 (four). The value of coherency is approximately zero when m is 5 (five). The value of coherency can be sufficiently suppressed when m is three or more.

As shown in FIG. 4, in the case of the infrared color filter 6d, interference of transmission lights can be reduced drastically and the transmission rate of the infrared color filter 6d can be the maximum, by setting m to five or more and selecting the film thickness calculated by the setting. The film thickness of the infrared color filter 6d is 1333 nm (=a value of point A), when m is 5 (five), for example. The interference of the transmission lights can be reduced drastically by setting the film thickness of the infrared color filter 6d to 1333 nm or more.

The film thicknesses of the red color filter 6c, the green color filter 6b and the blue color filter 6a can be calculated so as to suppress interference of transmission lights, as will be explained below, using the same method as that for the infrared color filter 6d described above.

In the case of the red color filter 6c, a natural light is adopted as an incident light, the transmission light wavelength λ is 610 nm that is a main wavelength of the color band of the red color filter 6c, and the refractive index n of the red color filter 6d is 1.5. The value of coherency can be sufficiently suppressed when m is three or more.

Interference of the transmission lights can be reduced drastically and the transmission rate of the red color filter 6c can be the maximum, by setting m to five or more and selecting the film thickness calculated by the setting. The film thickness of the red color filter 6c is 1016 nm, when m is 5 (five), for example. The interference of the transmission lights can be reduced drastically by setting the film thickness of the red color filter 6c to 1016 nm or more.

In the case of the green color filter 6b, a natural light is adopted as an incident light, the transmission light wavelength λ is 540 nm that is a main wavelength of the color band of the green color filter 6b, and the refractive index n of the green color filter 6b is 1.5. The value of coherency can be sufficiently suppressed when m is three or more.

Interference of the transmission lights can be reduced drastically and the transmission rate of the green color filter 6b can be the maximum, by setting m to five or more and selecting the film thickness calculated by the setting. The film thickness of the green color filter 6b is 900 nm, when m is 5 (five), for example. The interference of the transmission lights can be reduced drastically by setting the film thickness of the green color filter 6b to 900 nm or more.

In the case of the blue color filter 6a, a natural light is adopted as an incident light, the transmission light wavelength λ is 450 nm that is a main wavelength of the color band of the blue color filter 6a, and the refractive index n of the blue color filter 6a is 1.5. The value of coherency can be sufficiently suppressed when m is three or more.

Interference of the transmission lights can be reduced drastically and the transmission rate of the blue color filter 6a can be the maximum, by setting m to five or more and selecting the film thickness calculated by the setting. The film thickness of the blue color filter 6a is 750 nm, when m is 5 (five), for example. The interference of the transmission lights can be reduced drastically by setting the film thickness of the blue color filter 6a to 750 nm or more.

In the above described setting, it is assumed that wavelength dispersion does not occur in the color filters 6a to 6d, and refractive index distribution does not occur depending on light wavelength.

When wavelength dispersion occurs in color filters 6a to 6d and refractive index distribution depending on light wavelength occurs, the values of the refractive indexes of the color filters 6a to 6d do not become same. The film thickness of any one of the color filters can be calculated by substituting the value of the refractive index at the time of occurrence of refractive index distribution for n in the formula (4). In this case, the following relationships are not always satisfied.

The film thickness of the blue color filter 6a < the film thickness of the green color filter 6b

The film thickness of the green color filter 6b < the film thickness of the red color filter 6c

The film thickness of the red color filter 6c < the film thickness of the infrared color filter 6d

Though the embodiment mentioned above is an example applied to a back side illumination type solid state imaging device, the embodiment may be applied to a front side illumination type solid state imaging device. In the embodiment, the infrared color filter 6d is provided in order to fit an environment such as night, but the infrared color filter 6d may be omitted. Though the embodiment is an example applied to a CMOS solid state imaging device, the embodiment may be applied to a CCD solid state imaging device.

As described above, in the solid state imaging device of the embodiment, the relationship between the light path lengths La to Ld of the color filters 6a to 6d is set to La<Lb<Lc<Ld. Accordingly, interference of the transmission lights can be reduced sufficiently, and degradation of images can be prevented.

The film thickness d of the color filters 6a to 6d is set to satisfy the value equal to (λ×m)/2n or more. The m is set to an integer of three or more. Therefore, the transmission rate of an incident light can be improved, and high quality of the solid state imaging device 80 can be attained. Especially, by setting m to an integer of five or more, interference of transmission lights can be reduced drastically and the transmission rate of an incident light can be improved.

In the embodiment, steps formed between the color filter 6a to 6d are flattened by the flattening film 7, and micro lenses 8 are formed on the flattening film 7. Therefore, the fabrication yield of the solid state imaging device 80 can be improved.

While certain embodiments have been described, these embodiments have been presented by way of example only and are not intended to limit the scope of the inventions. Indeed, the novel devices described herein may be embodied in a variety of other forms; furthermore various omissions and substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A solid state imaging device, comprising:
    a semiconductor substrate;
    first, second, and third photoelectric conversion portions provided in a surface region of the semiconductor substrate;
    a blue color filter provided at a position corresponding to the first photoelectric conversion portion, the blue color filter having a first film thickness to give a first light path length;
    a green color filter provided at a position corresponding to the second photoelectric conversion portion, the green color filter having a second film thickness to give a second light path length longer than the first light path length;
    a red color filter provided at a position corresponding to the third photoelectric conversion portion, the red color filter having a third film thickness to give a third light path length longer than the second light path length;
    a flattening film formed on the blue color filter, the green color filter, and the red color filter, the flattening film flattening steps of the color filters; and
    micro lenses provided on the flattening film, each of the micro lenses being formed at a position corresponding to each of the first, the second, and the third photoelectric conversion portions, wherein
    each of the film thicknesses d of the color filters is set approximately to satisfy $d=(\lambda \times m)/(2 \times n)$ or more, where $\lambda$ is a central wavelength of each color band of the color filters, m is an integer of three or more, and n is each refractive index of the color filters.

2. A solid state imaging device according to claim 1, wherein the solid state imaging device is a back side illumination type.

3. A solid state imaging device according to claim 1, wherein the m is an integer of five or more.

4. A solid state imaging device according to claim 1, further comprising:
    a fourth photoelectric conversion portion provided in the surface region of the semiconductor substrate;
    an infrared color filter provided at a position corresponding to the fourth photoelectric conversion portion, the infrared color filter having a fourth film thickness to give a fourth light path length longer than the third light path length; and
    a micro lens provided on the flattening film, the micro lens being formed at a position corresponding to the infrared color filter, wherein
    the flattening film is formed between the color filters and the micro lenses provided at the position corresponding to the color filters, and the flattening film flattens steps of the color filters.

5. A solid state imaging device according to claim 4, wherein the solid state imaging device is a back side illumination type.

6. A solid state imaging device according to claim 4, wherein each of the film thicknesses d of the color filters is set approximately to satisfy $d=(\lambda \times m)/(2 \times n)$ or more, where $\lambda$ is a central wavelength of each color band of the color filters, m is an integer of three or more, and n is each refractive index of the color filters.

7. A solid state imaging device according to claim 6, wherein the m is an integer of five or more.

8. A solid state imaging device, comprising:
    a semiconductor substrate having two principal surfaces;
    an interconnection region portion formed on one of the principal surfaces of the semiconductor substrate;
    first, second, and third photoelectric conversion portions formed in a surface region of the semiconductor substrate, the surface region being in contact with the one of the principal surfaces;
    a blue color filter provided at a position corresponding to the first photoelectric conversion portion on a side of the other of the principal surfaces of the semiconductor substrate, the blue color filter having a first film thickness to give a first light path length;
    a green color filter provided at a position corresponding to the second photoelectric conversion portion on a side of the other of the principal surfaces of the semiconductor substrate, the green color filter having a second film thickness to give a second light path length longer than the first light path length;
    a red color filter provided at a position corresponding to the third photoelectric conversion portion on a side of the other of the principal surfaces of the semiconductor substrate, the red color filter having a third film thickness to give a third light path length longer than the second light path length;
    a flattening film formed on the blue color filter, the green color filter, and the red color filter, the flattening film flattening steps of the color filters; and
    micro lenses provided on the flattening film, each of the micro lenses being formed at a position corresponding to each of the first, the second, and the third photoelectric conversion portions, wherein
    each of the film thicknesses d of the color filters is set approximately to satisfy $d=(\lambda \times m)/(2 \times n)$ or more, where $\lambda$ is a central wavelength of each color band of the color filters, m is an integer of three or more, and n is each refractive index of the color filters.

9. A solid state imaging device according to claim 8, wherein the solid state imaging device is a back side illumination type.

10. A solid state imaging device according to claim 8, wherein the m is an integer of five or more.

11. A solid state imaging device according to claim 8, further comprising:
    a fourth photoelectric conversion portion formed in the surface region of the semiconductor substrate, the surface region being in contact with the one of the principal surfaces;
    an infrared color filter provided at a position corresponding to the fourth photoelectric conversion portion on the side of the other of the principal surfaces of the semiconductor substrate, the infrared color filter having a fourth film thickness to give a fourth light path length longer than the third light path length; and
    a micro lens formed at a position corresponding to the infrared color filter, wherein the flattening film is formed between the color filters and the micro lenses provided at the position corresponding to the color filters, and the flattening film flattens steps of the color filters.

12. A solid state imaging device according to claim 11, wherein the solid state imaging device is a back side illumination type.

13. A solid state imaging device according to claim 11, wherein each of the film thicknesses d of the color filters is set approximately to satisfy $d=(\lambda \times m)/(2 \times n)$ or more, where $\lambda$ is a central wavelength of each color band of the color filters, m is an integer of three or more, and n is each refractive index of the color filters.

14. A solid state imaging device according to claim 13, wherein the m is an integer of five or more.

* * * * *